United States Patent [19]

Rentsch et al.

[11] Patent Number: 4,577,115

[45] Date of Patent: Mar. 18, 1986

[54] APPARATUS FOR SENSING TRANSIENT PHENOMENA IN RADIANT ENERGY IMAGES

[75] Inventors: Edward M. Rentsch, Plainsboro; Larry A. Freedman, East Brunswick, both of N.J.

[73] Assignee: RCA Corporation, Princeton, N.J.

[21] Appl. No.: 439,995

[22] Filed: Nov. 8, 1982

[51] Int. Cl.⁴ ............................................. H01L 31/00
[52] U.S. Cl. ...................................... 250/578; 357/24; 358/213
[58] Field of Search ....................... 250/578, 208, 209; 307/311; 357/24 LR; 358/213

[56] References Cited

U.S. PATENT DOCUMENTS

| | | |
|---|---|---|
| 3,777,061 | 12/1973 | Takemura . |
| 3,931,463 | 6/1974 | Levine . |
| 4,064,533 | 12/1977 | Lampe et al. .................. 357/24 LR |
| 4,301,471 | 11/1981 | Holscher et al. .................. 358/213 |
| 4,339,665 | 6/1982 | Utagawa et al. . |

FOREIGN PATENT DOCUMENTS 1443718 7/1976 United Kingdom .

Primary Examiner—Edward P. Westin
Attorney, Agent, or Firm—Joseph S. Tripoli; Robert L. Troike; Allen LeRoy Limberg

[57] ABSTRACT

Delay for a field time is introduced between the end of the time a field of pixel samples is transferred from the A register into the B register of a field-transfer CCD imager and the beginning of the time the field of pixel samples is transferred from the B register to the C register. Such field delay is useful in differentiating response to a radiant energy image with respect to time, for example. A field of pixel samples is delayed in a first B register sufficiently long to be in time registration with a succeeding field of pixel samples in a second B register and responses to these samples are differentially combined to provide indications of transient phenomena in one field and not the other or in one field for longer time than in the other. The two B registers may be in two CCD imagers receiving images in spatial registration or may be in a CCD imager in which one A register alternately supplies samples to the two B registers.

6 Claims, 4 Drawing Figures

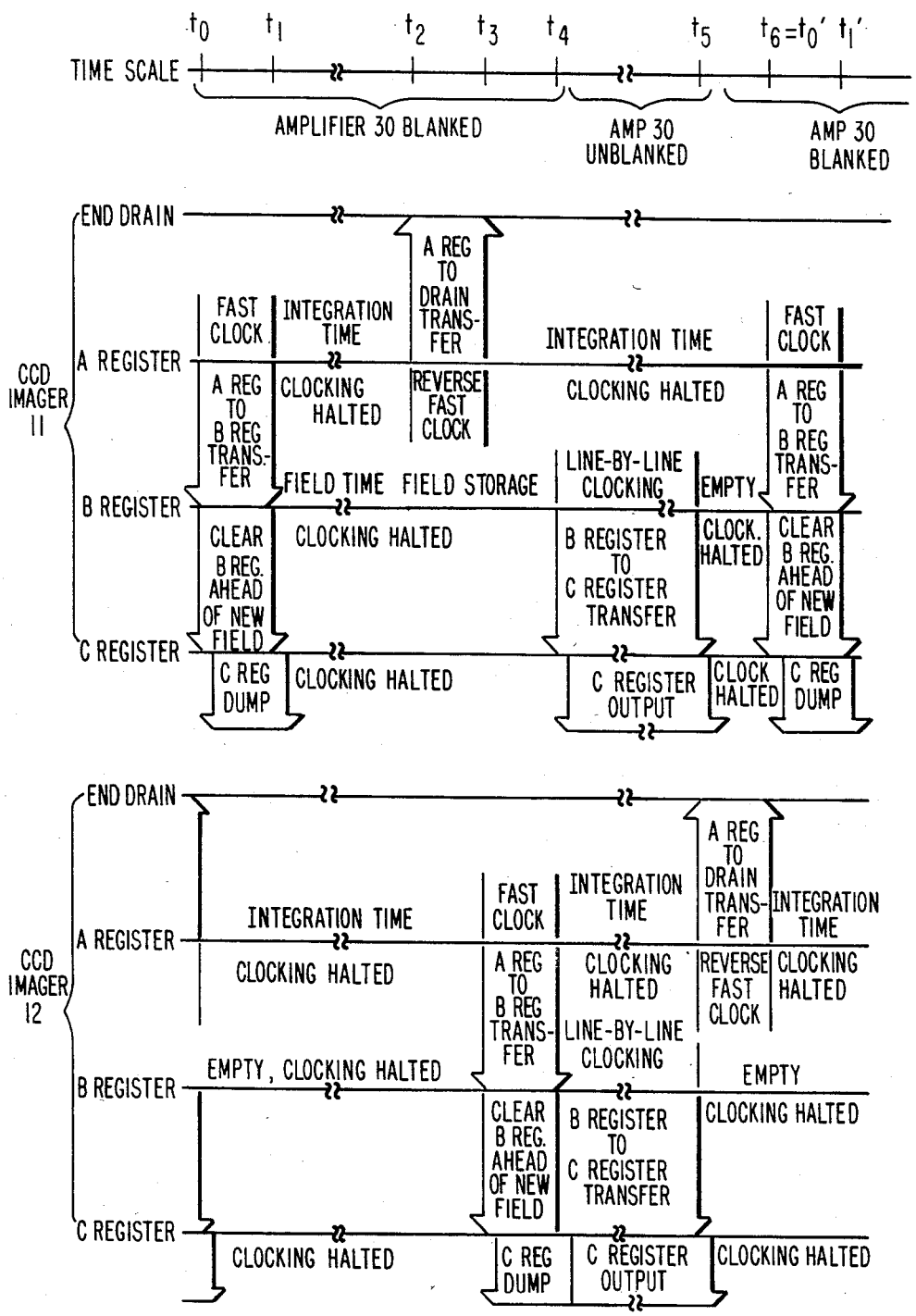
Fig. 2 TIMING DIAGRAM

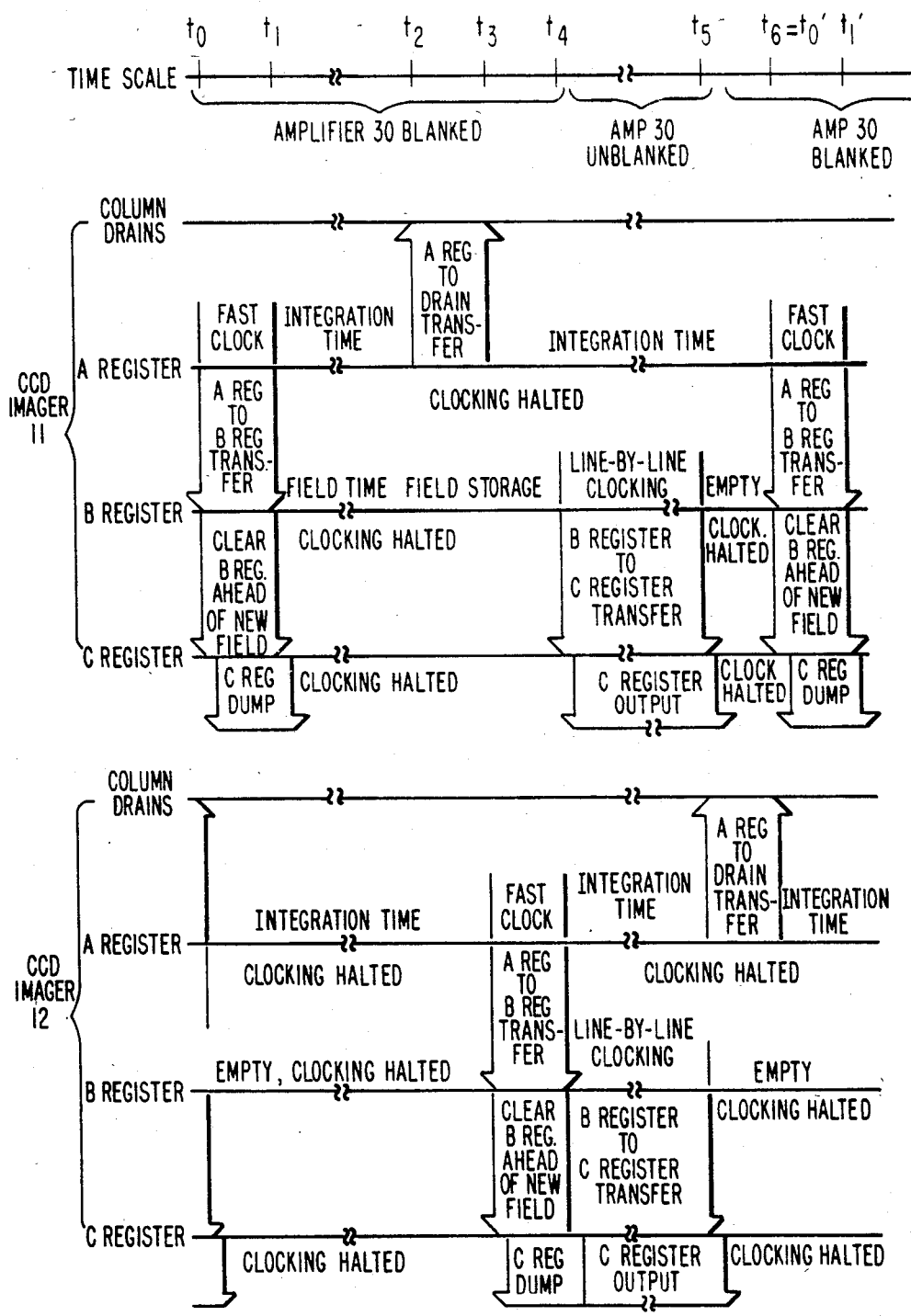
Fig. 3 TIMING DIAGRAM

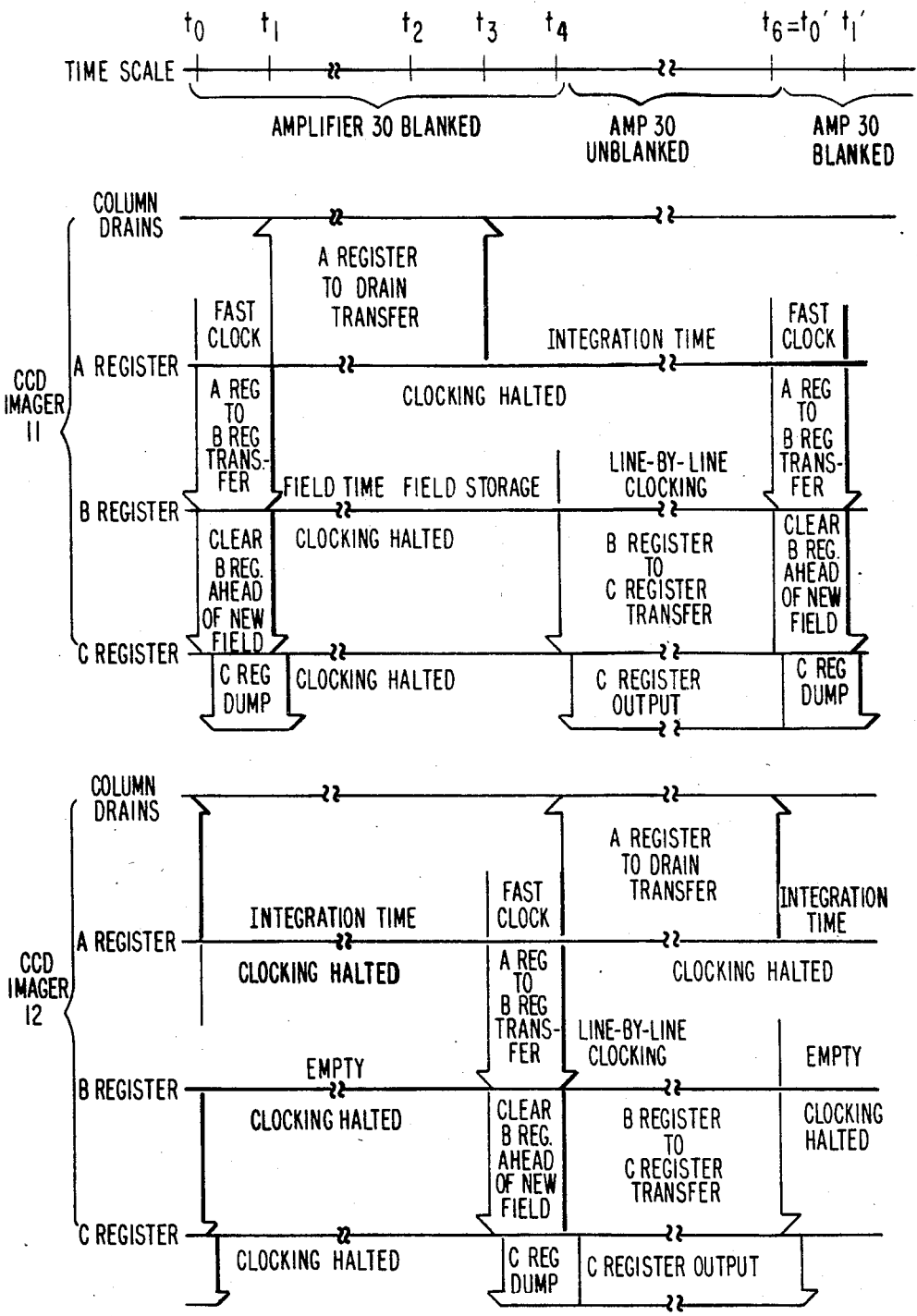
Fig. 4 TIMING DIAGRAM

APPARATUS FOR SENSING TRANSIENT PHENOMENA IN RADIANT ENERGY IMAGES

The present invention relates to apparatus including CCD imagers, for generating differentials with respect to time of scanned responses to radiant energy images—useful, by way of example, for specifying the location of lightning flashes in the atmosphere of a planet.

A primary problem in the reconnaisance of the earth's atmosphere by a synchronous-orbit satellite to locate lightning flashes is to separate radiant energy attributable to less intense flashes of lightning from background radiant energy attributable to sunlight reflected to the satellite from the atmosphere, clouds, and the surface of the earth. This separation is achieved in part by limiting the spectral response of the lightning sensor to narrow bands where a substantial portion of the radiant energy from the lightning flash occurs. The lightning stroke ionizes the air through which it passes. Some 15% of the energy in the spectral response is within $\pm 5$ Å of the first oxygen emission line OI(1) at 7744 Å; and some 10% of the energy in the spectral response is within $\pm 5$ Å of the first nitrogen emission line, NI(1), at 8683 Å. These two spectral responses are the principal ones. The 7744 Å line in the near-to-visible-spectrum infrared is at a frequency to which silicon imaging device sensors are sensitive, besides being the strongest spectral line.

The imaging device will typically be presented with the radiant energy image of a large expanse of the earth's atmosphere—e.g., that over the contiguous United States of America—so the area in the image taken up by lightning flashes that are isolated or contained in a local storm will be small, as compared to the expanse of sunlit atmosphere encountered in full daytime. Supposing the sensing device to be one which analyzes the received radiant energy image into picture elements, or pixels, decreasing pixel size will for those pixels responding to lightning flash enhance the ratio of energy generated by lightning flash to background energy from reflected sunlight. A silicon CCD imager of the field-transfer type that is proposed for commercial use provides for a $540 \times 256$ pixel non-interlaced sampling of an image. Assume 70% quantum efficiency in such an imager and an essentially lossless f/1 lens in the synchronous-orbit satellite for focusing an image of the earth's atmosphere on the imager. During a five millisecond image integration time a $2.1 \cdot 10^6$ electrons/pixel power level could be generated in the $7744 \pm 5$ Å band, from reflected sunlight, assuming irradiance of 0.12 watts per square meter per Angstrom. Only $1.6 \cdot 10^4$ electrons/pixel at $7744 \pm 5$ Å could be provided by a $10^7$ watt lightning stroke, assuming a one millisecond stroke time. In practice, during full daylight, substantial (e.g., 24 dB) optical attenuation is introduced into the optics used for spectral filtering and focusing of the filtered image on the CCD imager image register to avoid blooming—i.e., overfilling of the storage wells in the CCD imager. About ninety percent of all lightning strokes are at least $10^7$ watt power, with $10^{13}$ watts being the maximum power. To avoid non-response to a significant number of all lightning strokes, sensitivity to $10^7$ watt-strokes is a practical requirement; so the lightning sensing apparatus must separate response to lightning that is somewhat less than one percent of the background attributable to sunlit clouds.

Time differentiation of the radiant energy image, by differentially combining the present image and a previous image delayed in time, can be used to reduce the background, which is relatively slow-changing respective to lightning strokes. Lightning strokes typically last only about one millisecond. The time differential, $\Delta t$, between the times at which occur the images to be differentially combined should be slightly in excess of twice the time for lightning strokes to occur, in order to suppress aliasing that arises from the energy from the lightning stroke being apportioned in like amounts between the image fields being differentially combined in the differentiation process—but only slightly so, in order to enhance lightning strokes respective to background as much as possible. A $\Delta t$ of about 2.5 milliseconds is optimum. Supposing the use of a single CCD imager to supply image samples in a raster-scanned format, it is necessary to choose the time differential to equal field time or a multiple m thereof. It would be desirable, then, to use a field time of about 2.5 milliseconds. Then, video sampling rate must be fast enough that the $500 \times 256 \times m$ pixels can be satisfactorily sampled in somewhat less than $2.5 \times m$ milliseconds, allowing for field retrace times. Practically, this means a video sampling rate of around 38 MHz.

If one wishes to use a digital field store to delay fields of image samples by $\Delta t$ for use in image differentiation, the analog-to-digital converter (ADC) will have to maintain at least a 30 MHz conversion rate. The ADC will have to provide at least eight-bit accuracy in order to provide sufficient resolution to just distinguish the number of electrons per pixel due to $10^7$ watt lightning stroke from the number due to background irradiance of 0.12 watts per meter per Angstrom in the $\pm 7.5$ Å band around 7744 Å. This pushes the state of the art in ADC design; and ADC's with the ten-bit 40 MHz conversion rate one would like to use have not been qualified for use in spacecraft.

An analog field store which requires no ADC and (which might be constructed in CCD technology, for example,) could be used after the CCD imager. But analog field stores, as such, are not available. However, an analog field store is a component in CCD imagers of the field transfer type.

A field-transfer CCD imager conventionally comprises an image (or A) register, a field store (or B) register, and a parallel-to-serial-data-converting read-out (or C) register. These three registers cooperate to generate video signal that samples the radiant energy image in a raster scan pattern. The A register, which is exposed to the radiant energy image, comprises a plurality of parallelled charge transfer channels in which clocking is halted during image integration (or field trace) times when charge packets, which sample the radiant energy image projected into the A register, are accumulated in the storage wells by collection of carriers generated by photoconversion. The B register comprises a plurality of parallelled charge transfer channels in cascade connection after respective ones of the A register charge transfer channels. The C register is a line register, a single charge transfer channel having stages parallelly loaded from the charge transfer channels of the B register and then serially operated as a shift register to perform a parallel-to-series data conversion. During each of the image integration times the image sampled during the previous image integration time is clocked forward a line at a time from the B register to load the C register in parallel. This is conventionally done during each of the line retrace intervals, and the C register is read out serially during the ensuing line trace interval.

During field transfer (or field retrace) interval the A register is clocked in synchronism with the B register to transfer the new field of image samples from the A register to the B register. At the outset of field retrace, the B register has remnant integrated dark current charges, which grew up behind the image samples clocked through it in the previous field. In usual operation these remnant dark current charges are cleared out ahead of the new field entering the B register during the A-register-to-B-register transfer by clocking them from the B register to the C register and then out of the C register to a drain during this time.

Field-transfer CCD imagers may use single-phase, dual-phase, or multiple-phase clocking in their registers. Where reverse clocking of the A register is to be used to move charge packets through its charge transfer channels in a direction opposite to that in which they move with normal clocking, as will be done in certain embodiments of the present invention, multiple-phase clocking of the A and B registers facilitates charge transfer direction being controlled by clock phasing alone. The use of internal drift fields in the charge transfer channels to control transfer direction as done in single-phase and certain dual-phase clocking schemes do not ordinarily allow the direction of charge transfer to be changed.

An aspect of the invention is, where it is desired to use an analog field store following the read-out register of a conventionally clocked CCD imager of field transfer type, to use instead the CCD imager by itself, clocking it unconventionally so as to extend the duration of field storage in the field storage register preceding its read-out register. The invention in a further of its aspects is embodied in apparatus using the analog field store already contained in a CCD imager of the field-transfer type for obtaining the $\Delta t$ delay differential between image fields that are to be differentially combined to obtain time-differentiated image response.

In the drawing:

FIG. 2 is a timing diagram of the clocking for the FIG. 1 apparatus when CCD imagers without capability to electronically suppress image integration are used;

FIG. 3 is is a timing diagram of the clocking for the FIG. 1 apparatus when CCD imagers with capability for dumping integrated image charge are used; and FIG. 4 is a timing diagram of the clocking for the FIG. 1 apparatus when CCD imagers with capability for dumping integrated image charge or imagers in which charge integration in the A register can be interrupted are used.

Figure 1:
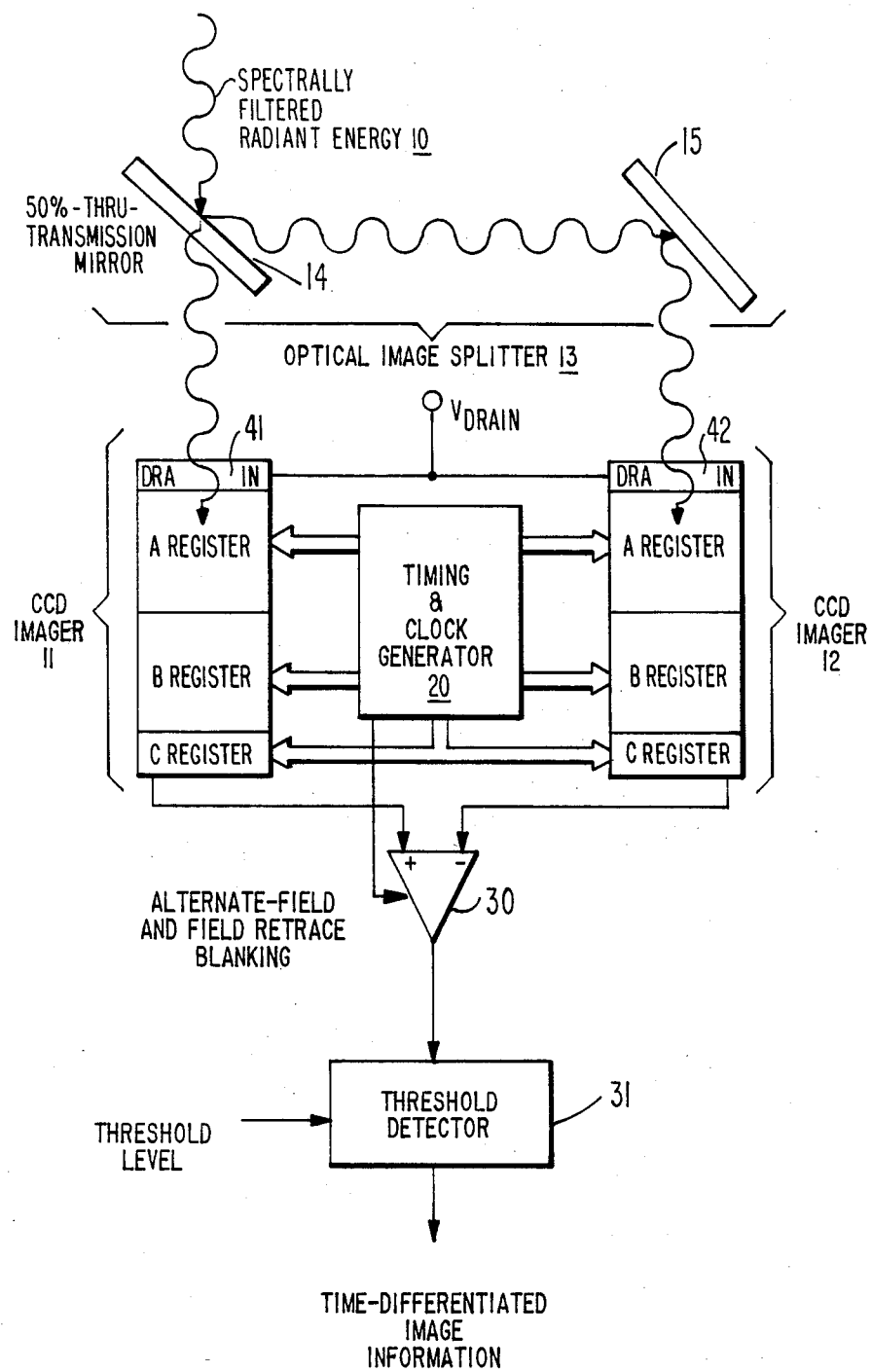
FIG. 1 is a block diagram of a sensor system in which the present invention is embodied.

In FIG. 1 the incoming spectrally filtered radiant energy 10 conveying an image of the earth's atmosphere, for example, is optically divided for application to CCD imagers 11 and 12, which are of field-transfer type. Imager 11 and imager 12 are operated with staggered image integration times and provide non-interlaced raster-scanned video responses to relatively delayed and non-delayed image integration intervals. These responses are differentially delayed respective to their integration times to provide time registration of their component video samples corresponding to the spatial registration of the imager pixels generating these samples. The differentially delayed video responses are subsequently differentially combined to provide time-differentiated video response to the image conveyed by incoming radiant energy 10. The differential delay of the responses of imagers 11 and 12 is obtained by storing imager 12 image (or A) register response after transfer to its field store (or B) register for a time $\Delta t$ in that field store register before transferring the response line by line through imager 12 read-out (or C) register.

The optical division of the image is done in an optical image splitter 13 such that imagers 11 and 12 receive substantially identical images in the same spatial registration in their A registers. Image splitting may be done without perversion, for example, using an image splitter 13 comprising a 50% through-transmission flat plate mirror 14 and a no-through-transmission flat plate mirror, both mirrors being disposed at 45° angles to a plane in which repose the surfaces of the A registers of imagers 11 and 12. Then, imagers 11 and 12 can use identical (rather than mirrored) C, registers.

CCD imager 12 is used to provide a raster-scanned video output signal which is subjected to only conventional delays, its B register being clocked for read-out to its C register just after it has been clocked for write-in from its A register. The operation of CCD imager 11 departs from custom. To provide a raster-scanned video output signal which is subjected to an extra delay $\Delta t$ in addition to conventional delays, its B register is clocked for read-out to its C register at time $\Delta t$ later than its having been clocked for write-in from its A register.

The B and C registers of imagers 11 and 12 are clocked synchronously to provide relatively non-delayed and delayed video signals to separate ones of the inverting and non-inverting terminals of a differential-input amplifier 30. Amplifier 30 differentially combines the video output signals of imagers 11 and 12 to develop time-differentiated image information supplied as input signal to a threshold detector 31.

Assuming the staggering of the integration intervals in imagers 11 and 12 to be such as to interleave them in time, the differential combining is done by amplifier 30 during alternate field trace intervals (image integration intervals) with blanking of its output being effected during intervening fields and during field retrace intervals (image transfer intervals) responsive to blanking signals from timing and clock generator 20. In such case it is convenient to number fields consecutively to consider the relatively delayed image integration intervals to occur during odd-numbered fields and to consider the relatively non-delayed image intervals to occur during even-number fields. The use of interlace is not to be inferred from the odd and even numbering of fields.

Detector 31 is of a type that supplies, as output, indications of the absolute amplitude of its input signal exceeding a threshold value. Detector 31 may, for example, comprise voltage comparators comparing amplifier 30 output voltage to positive and negative threshold voltages and an OR gate receptive of the comparator output signals. The OR gate is connected to respond to either the one comparator indicating amplifier 30 output voltage being more negative than negative threshold voltage, or to the other comparator indicating amplifier 30 output voltage being more positive than positive threshold voltage.

An alternative detector 31 is a full-wave rectifier of amplifier 30 output voltage, followed in cascade by a voltage comparator. Alternate-field and field retrace blanking may be done in the charge sensing stages of the CCD imagers 11 and 12 themselves or in detector 31 rather than or in addition to being done in differential-input amplifier 30. The differential-input amplifier 30 and threshold detector 31 functions will share common circuit elements in some designs.

Since the ratio of lightning stroke energy as compared to background energy will vary with the incident angle of the sun on the earth's atmosphere, it is desirable in more sophisticated designs to control the value of the threshold level and the CCD imager image integration time, responsive to spacecraft chronometer and sun angle correction circuitry. In more sophisticated designs, too, differences in the fixed pattern noise in each CCD imager video output signal can be reduced by introducing compensating signal taken from a read-only memory addressed in synchronism with the raster scanning pattern in the video output signal.

Not only is it desirable to stagger the image integration times in the A registers of CCD imagers 11 and 12, it is desirable to avoid overlapping of the image integration times insofar as generating the video responses that are to be differentially combined in amplifier 30. It is preferable to alternate the image integration times used to generate the video responses so there are no intervening intervals between any of them during which the system would be non-responsive to lightning energy. Overlapping rather than alternating image integration times, could double the amount of charge accumulated in response to background. There would also be increased charge accumulation in response to lightning strokes. But response to this latter increased charge accumulation would be cancelled, together with response to background, in the differential combining process carried out in amplifier 30. To avoid blooming on charge generated responsive to brightly sunlit cloud background, which would undesirably interfere with ascertaining the location of lightning flashes, image energy to the imagers would have to be half what it may be in the advocated mode of operation. This would undesirably lead to reduction of the sensitivity to lightning strokes by 6 db.

In constructing apparatus for differentiating radiant energy images in accordance with the invention, it is desirable from the standpoint of reduced cost to use CCD imagers that are already being developed for broadcast television cameras. Such an imager is in the present state of CCD technology preferably a buried-channel device, because noise attributable to semiconductor surface defects is avoided in the video signal output. Such an imager is normally provided with anti-blooming drain structures disposed in its semiconductive-material substrate, being located between the charge transfer channels in its A register. There is normally also a drain structure disposed in its substrate at the end of the charge transfer channels in its A register remote from their connections to respective charge transfer channels in its B register. The interchannel drain structures connect physically and electrically to the end drain structure which, in turn, connects to pin-out to a supply of drain voltage $V_{DRAIN}$. (The bulk of the CCD substrate is in conventional practice grounded.)

The ability to select charge integrating intervals on a discontinuous basis is, as noted above, desirable for practicing the present invention. This was initially considered to be a formidable problem in using available CCD imagers of field-transfer type. Operating all the stages of the A register charge transfer channels in accumulation and letting an internal drift field, created in the substrate by graded doping, force charge carriers into the bulk of the substrate, could be done to suppress integration of charge in an imager without anti-blooming drains. The anti-blooming drain structures in the buried-channel CCD imagers being developed for broadcast camera usage, however, operate as a clamp on the electric field in the charge transfer channels to prevent this mode of operation.

Anti-blooming drain structures are desirable in the lightning mapping systems using buried-channel CCD imagers, despite an iris or successive neutral density filtering being included in the optical path before beam splitter 11 and being controlled to avoid radiant energy levels on the A registers becoming large enough to cause blooming on background energy. Since one does not want to reduce the response to lightning strokes that are just above background level to the point that it is no longer reliably distinguishable from dark current variations and residues of clocking signals, there is a practical lower limit on the amount of attenuation that can be introduced into the input optics of the system. To preserve sensitivity to low-energy lightning strokes the potential wells in the imager A register should fill to about 25% of full charge capacity on background. High-energy lightning strokes will then cause blooming, or overfilling of the potential wells in the A register. It is desirable that the overflow of charge be drained away in the anti-blooming drains so that the apparent location of the high-energy lightning stroke in the display is not shifted.

The inability of selectively allowing image integration in buried-channel CCD imagers presently available can be gotten around by arranging to selectively discard portions of the integrated image samples. P. A. Levine in U.S. Pat. No. 3,931,463 issued Jan. 6, 1976 and entitled "SCENE BRIGHTNESS COMPENSATION SYSTEM WITH CHARGE TRANSFER IMAGER" teaches that it is possible to construct a CCD imager with a drain structure at the end of its A register opposite to the end which connects to its B register, and that it is possible to reverse-clock the A register to move charge to this drain structure. Investigation has determined that a buried-channel CCD imager with anti-blooming drains has a structure equivalent to that of the CCD imager described by Levine. This may be attributable to the A register gate electrode structure being such that reverse clocking of the A register will transfer charge directly into the end drain structure used as a bias to the anti-blooming drain structures between A register charge transfer channels. If not, reverse-clocking of the A register piles up charge in the first row or so of that register which spills over into the anti-blooming drains and is thus conducted to the end drain structure. CCD imagers 11 and 12 of FIG. 1 are then shown as having respective end drain structures 41 and 42, but they do not have any special structure distinguishing them from broadcast camera devices presently in development.

In the field-transfer CCD imagers with anti-blooming drains presently being developed, the end drain structures interfere with parallel transferring of the A-register charge transfer channel outputs during reverse clocking, however, since charge packets from the various charge transfer channels of the A register merge at the drain.

The use on one substrate of a single A register to supply inputs to a plurality of B registers clocked in correspondence to those of separate imagers 11 and 12, which B registers in turn supply respective C registers located on the same substrate and clocked in synchronism, is advantageous in that it avoids the need for an optical image splitter. This general type of CCD imager is described by Y. Takemura in U.S. Pat. No. 3,777,061, issued Dec. 4, 1973, and entitled "SOLID STATE IMAGE PICKUP DEVICE." The field transfer from the A register to the second B register is through the second C register between the A register and second B register, so the raster scan sequence is the same for even-numbered and odd-numbered fields. The problem is to make such an imager in buried-channel rather than surface-channel form, in order to eliminate surface noise, and to provide anti-blooming drains without end drain structures that interfere with field transfer to the second B register. CCD imagers with one A register, first and second B registers, and first and second C registers and with anti-blooming drains contacted through the substrate from the surface opposite to that on which the gate electrodes are disposed are possible, for example, but require extra processing steps in their manufacture.

The FIG. 2 timing diagram shows, in detail, one way the clocking of the two CCD imagers 11 and 12 of the FIG. 1 apparatus may be carried out. CCD imagers 11 and 12 are presumed to have end drain structures 41 and 42 at the ends of their respective A registers opposite the ends connecting to their B registers. (As pointed out above the "end" drains may actually be provided by the ends of the antiblooming drain structures running between the columns of the image, or A, register). Timing diagrams for each of the A, B, and C registers of both imager 11 and 12 are plotted against a common time scale at the top of FIG. 2. For ease of pictoral illustration, time is foreshortened in the image integration times, image integration times generally being much longer respective to field transfer intervals than shown in FIG. 2.

The operation of the FIG. 1 apparatus diagramed in FIG. 2 is such that only every other integrated image field from each of the imagers 11 and 12 A registers is used to develop video output signal. Image integrated in imager 11 during odd fields is to be subsequently used to develop output signal during following odd fields, and image integrated in imager 12 during even fields is to be subsequently used to develop output signal during following odd fields. In each field transfer interval following an image integration interval, the image integrated in one of the imager A registers is forwarded to the associated B register, and the image integrated in the other imager A register is dumped into the drain (41 or 42) at the opposite end to its associated B register. In imager 11 the transferred field, integrated during an odd field is stored in the B register through the next image integration time and next field transfer time. Then this field, stored in the B register throughout the duration of the even field following its transfer, is read out through the C register of imager 11 during the image integration time of the next odd-field. The read-out is in sychronism with read-out through the C register of imager 12. In imager 12 the image response, integrated in its A register during the intervening even field and then transferred to its B register, is read out through its C register during the odd field image integration time immediately following the field transfer into the B register. Amplifier 30 is blanked except during the times the C registers of imagers 11 and 12 are read out in parallel with each other during even field integration times.

Considering the FIG. 2 timing diagram in detail, the interval between times $t_0$ and $t_1$ is the field transfer interval for CCD imager 11. Its A and B registers are clocked at fast rate in such phasing as to move charge packets in the forward direction. This is done to transfer to the B register image samples accumulated in the A register during the immediately preceding even-field image integration time. The C register of imager 11 is clocked between $t_0$ and $t_1$ to remove remnant dark current charge accumulated in the preceding B register during the previous field trace interval. Amplifier 30 is blanked, so it does not respond to video generated by the dumping of remnant dark current charge removed from the B register of imager 11 via its C register. Just prior to the interval between $t_0$ and $t_1$, the A register of imager 12 was clocked at a fast rate in such phasing as to move charge packets in the reverse direction, to dump charge accumulated during the preceding even field integration time into drain 42. From $t_0$ to $t_1$ clocking is halted in the imager 12, allowing image integration in its A register.

Between times $t_1$ and $t_2$ the clocking of the A, B and C registers of both imagers 11 and 12 is halted. In imager 11 the even field of image samples just clocked into its B register is being held in field storage for a full field time extending from time $t_1$ to time $t_4$. In imager 12 the B register is empty except for integrated dark current, there having been no A-register-to-B-register transfer since the completion of the last B-register-to-C-register transfer. Odd-field image integration is taking place in the A registers of both imagers 11 and 12 from time $t_1$ to time $t_2$. Amplifier 30 remains blanked.

In the field discard interval between times $t_2$ and $t_3$ the A register of imager 11 is clocked at a fast rate in such phasing as to move charge accumulated during the odd field in the reverse direction and dump it into drain 41. The clocking of the B and C registers of imager 11 is halted. Clocking remains halted in the imager 12, and image integration continues in its A register. Amplifier 30 remains blanked.

In the interval between times $t_3$ and $t_4$ clocking is halted in all the registers of imager 11, and even-field image integration commences in its A register. For imager 12 the time interval between times $t_3$ and $t_4$ is the field transfer interval. The A and B registers of imager 12 are clocked at a fast rate in the forward direction to transfer, to the B register, odd field image samples accumulated in its A register during the image integration interval between times $t_0$ and $t_3$. The C register of imager 12 is clocked to remove integrated dark current charges accumulated in the preceding B register during the previous field trace interval. Amplifier 30 is blanked and so does not respond to video signal generated by this charge-dumping process.

During the interval between times $t_4$ and $t_5$, clocking is halted in the A registers of both the imagers 11 and 12. Even-field integration continues in imager 11 A register and commences in imager 12 A register. The B registers of imagers 12 and 11 are clocked to transfer to their respective C registers the stored image samples respectively descriptive of the odd field integrated in imager 12 A register between times $t_0$ and $t_3$ and descriptive of the preceding even field integrated in imager 12 A register, prior to time $t_0$. These transfers are done a line at a time during line retrace, with clocking to the C registers being halted. During each line trace, the C registers of imagers 11 and 12 are clocked to transfer charge samples pixel-by-pixel to the output stages of their respective imagers. Amplifier 30 is unblanked to permit differential combining of the video signal responses to the C register outputs of imagers 11 and 12.

The field discard interval for imager 12 is between times $t_5$ and $t_6$. Its A register is clocked at a fast rate in such phasing as to move charge accumulated during the even field in the reverse direction and dump it into drain 42. The clocking of the B and C registers of imager 12 is halted. The clocking of the A, B, and C registers of imager 11 is halted, and imager 11 A register continues its even-field image integration. Blanking is re-established in amplifier 30.

The time $t_6$ is the end of one of the two-field cycles in which the image differentiation takes place and corresponds to time $t_0'$, the beginning of the next two-field cycle analogous to time $t_0$ of the cycle just described. This next cycle has time $t_1'$ (shown in FIG. 2) and times $t_2'$, $t_3'$, $t_4'$, $t_5'$, and $t_6'$ (not shown in FIG. 2) analogous respectively to time $t_1$ and times $t_2$, $t_3$, $t_4$, $t_5$, and $t_6$. And the cycles continue repeating.

It is preferable to clock the A register of imager 12 in interval $t_5$ to $t_6$ following the line-by-line transfer of the field from the B registers of the imagers, rather than during it, so there is no feedthrough of the reverse A register clocking into imager 11 video output. One may arrange to clock the A register of each of the imagers 11 and 12 in reverse direction simultaneously with the clocking of the A register of the other in the forward direction, so as to use the same set of multiple-phase clock voltages in different phase order. But arranging to clock for charge transfer in the reverse direction in each imager A register just before clocking to transfer charge in the forward direction in the other imager A register, per FIG. 2, eliminates a break in the continuity of the field integration times in the two imagers, as regards the accumulation of charge samples that are forwarded to their B registers.

Consider now how one arranges clocking for a special purpose CCD imager having one A register, first and second B registers at opposite ends of that A register, first C register at opposite end of the first B register from the A register, and a second C register between the A and second B registers, as generally described in U.S. Pat. No. 3,777,061. The A-register-to-drain transfer of imager 11 can, as noted above, be made to coincide in time with the A register-to-B-register transfer of imager 12. The A-register-to-drain transfer in the special-purpose CCD imager is then replaced by A-register-to-second-B-register transfer, while the A-register-to-B-register transfer is used as A-register-to-first-B-register transfer.

FIGS. 3 and 4 timing diagrams are modifications of the FIG. 2 timing diagram which show how the clocking of the two CCD imagers 11 and 12 of the FIG. 1 apparatus may be carried out when the imagers are of a type in which the blooming drains underlie blooming barrier gates that are accessible for application of control voltage signals. Such CCD imagers are described by W. F. Kosonocky in United Kingdom Pat. No. 1 443 718 entitled, "CONTROL OF 'BLOOMING' IN CHARGE-COUPLED, IMAGE SENSING ARRAYS" and published July 21, 1976. Timing clock generator 20 may pulse the blooming barrier gates in the A register to lower the barrier height enough, not only to prevent accumulation of charge carriers in the depletion regions, but to dump charge carriers already collected in those regions into the anti-blooming drains between imager columns, in accordance with FIG. 3 timing diagram. Charge dumping from the imager 11 A register into its column anti-blooming drains is done between times $t_2$ and $t_3$; similar charge dumping takes place in imager 12 between times $t_5$ and $t_6$. The problem of A register reverse-clocking feeding through to imager output does not present itself, so the B-register-to-C-register transfer and C-register-output clocking can be extended from time $t_4$ until time $t_6$. This mode of operation may be used as shown in the FIG. 4 diagram as well, where image integration is prevented entirely between times $t_1$ and $t_3$ in imager 11 and is prevented entirely between times $t_4$ and $t_6$ in imager 12.

Alternatively with the Kosnocky structure, timing and clock generator 20 may, in accordance with FIG. 4, pulse the blooming barrier gates to produce fields that control the movement of minority charge carriers generated outside the depletion regions induced under the front surface gate electrodes used for charge transfer in the A register, preventing their diffusion to those depletion regions and directing them instead to the blooming drains. This means of shortening image integration time depends on preventing charge carriers from reaching the depletion regions under the A register transfer gate electrodes, rather than on the emptying out of charge already collected in the depletion regions induced under the transfer gate electrodes. Accordingly, the blooming barrier gates are pulsed to prevent image integration from a time no later than immediately after A-register-to-B-register transfer until one field time after the beginning of the transfer. Indeed, the pulsing may preferably start at the beginning of A-register-to-B-register transfer and prevent image integration for a full field interval, to reduce transfer smear, departing in this regard slightly from the FIG. 4 timing diagram. It is important to understand that "A register to drain transfer" in this mode of operation refers to a transfer from the bulk portions of the A register substrate, not to transfer from the induced depletion regions under the transfer gates. Again, also, the B-register-to-C-register and C-register-output clocking can be extended from time $t_4$ until time $t_6$, and this is shown in the FIG. 4 timing diagram.

Another way to use electric fields in preventing charge carriers generated in the bulk from reaching the depletion regions under the A register charge transfer electrodes can be carried out using imagers of the type proposed by J. E. Carnes in U.S. Pat. No. 4,040,092 issued Aug. 2, 1977 and entitled "SMEAR REDUCTION IN CCD IMAGERS". Carnes describes a back-surface-illuminated CCD imager having a thinned semiconductor substrate, a transparent back electrode, and a back surface drain. Pulses are applied to the back electrode during field transfer to sweep carriers generated by photo response into an electrostatically induced depletion region and then into the back surface drain. These pulses can be lengthened to forestall image integration until a later time, in implementing the present invention. The timing diagrams are essentially the same as in the alternative Kosonocky method, but the discarded charge carriers flow into the back surface drain, rather than into the blooming drain structures.

Still another way to use electric fields in preventing charge carriers generated in the bulk from reaching the depletion regions under the A register charge transfer electrodes can be carried out using imagers of a type proposed by E. D. concurrently filed U.S. Ser. No. 439,994, filed 11/8/82 , entitled, "INTERRUPTING CHARGE INTEGRATION IN SEMICONDUCTOR IMAGERS EXPOSED TO RADIANT EN- ERGY" and assigned to RCA Corporation. Savoye describes a back-surface-illuminated CCD imager having a thinned semiconductor substrate joined by a transparent insulative cement to a glass backing plate coated with a transparent conducting oxide electrode, to which electrode voltage pulses can be applied for selectively inducing a drift field from front to back surface of the semiconductor substrate. This field provides a surface trap at the back surface of the semiconductor substrate to which charge carriers generated in the bulk migrate and recombine. The timing diagrams are essentially the same as for the alternative Kosonocky method, but the charge carriers remain in the substrate rather than flowing through the blooming drain structures.

Where the accumulation of charge packets in the depletion regions under the A register transfer gate electrodes is prevented, rather than there being accumulation of charge packets followed by dumping of these charge packets to drain, the A-register-to-B-register transfer in imager 11 can coincide with that in imager 12. That is, field storage is in the A register of imager 11, as well as its B register. In fact, CCD imagers 11 and 12 may be replaced by line transfer imagers with similar apparatus for suppressing charge accumulation.

In any case, where CCD imagers 11 and 12 of field effect type are used, it is advantageous that they have back surface electrode, so that they can be operated to suppress transfer smear during clocked transfers of charge packets from A register. During such transfers the migration of charge carriers generated in the bulk, from the bulk to image integration sites at the front surface of the imager, is interdicted by inducing the drift field from front to back surface of the semiconductor substrate.

The lightning sensors thus far described are relatively insensitive to lightning occurring during field transitions. The image splitter could be made to be a four-way image-splitter to facilitate operating two lightning sensors staggered in time to provide more continuous sensitivity. It is simpler, however, to use a three-way image-splitter with a first CCD imager being clocked conventionally to provide undelayed image information responsive to every field, and with second and third CCD imagers delaying alternate fields for one field time as done in imager 11 of the FIG. 1 apparatus. The second and third imager outputs are alternately selected field-by-field for differential combination with the first imager output to generate differentiated image information. These lightning sensors are continuously sensitive. Continuous sensitivity can also be provided by operating a multiplicity of individual lightning sensors staggered in time.

One may operate two (or more) lightning sensor systems parallelly in time and confirm the existence of lightning stroke in a portion of raster scan based on every system responding, to cut down the possibility of false detection arising from defects in the imagers. Parallelled sensor systems operating on different spectral lines characteristic of the transient phenomenon to be sensed may be used for better separating that phenomenon.

What is claimed is:

1. A sensor system for locating transients in a radiant energy image, said sensor system comprising:

first and second CCD imagers of a field transfer type arranged to respectively receive substantially identical first and second portions of said radiant energy image in spatial registration with each other;

timing generator means supplying clocking signals to said first and second CCD imagers for causing them to sense at staggered times said first and second portions of said radiant energy image and to supply in synchronism responses to said first and second portions of said radiant energy image from successive pairs of their sensing times, the responses being supplied in synchronism according to a predetermined recurrent scan pattern relating timing to spatial location in the radiant energy image;

means for differentially combining those responses; and means, responding to the amplitude of the differentially combined responses being too large to lie within the bounds of a range of amplitude values, for indicating the existence of a transient in the radiant energy image.

2. Apparatus for generating a differential with respect to time of the scanned response to a radiant energy image, said apparatus comprising:

CCD imager means having first and second field store registers independent of each other with synchronized line-by-line clocking during their being simultaneously read out from, having first and second output registers with synchronized clocking for respectively performing parallel-to-serial conversion of a signal read from said first field store register and parallel-to-serial conversion of a signal read from said second field store register, and having image register means providing integrated responses to first and to second temporal portions of said radiant energy image in spatial registration with each other, but interleaved in time, for writing respectively into said first field store register and into said second field store register during succissive times;

means responding to the difference of the converted signals from said first and second output registers for supplying an image differentiated with respect to time signal; and means for providing output indications responsive to said image differentiated with respect to time signal exceeding a prescribed threshold level.

3. Apparatus as set forth in claim 2 including:

means for optically dividing said radiant energy image into at least first and second portions;

a first image register included in said image register means for integrating in packets charge generated by photoconversion therein of said first portion of said radiant energy image, said integration occurring during at least a portion of each time interval between successive intervals of clocking said first field store register for writing thereinto, said first image register being clocked in a proper direction for transferring its packets of integrated charge to said first field store register during the time said first image register is being written into; and a second image register included in said image register means for integrating in packets charge generated by photoconversion therein of said second portion of said radiant energy image, said integration occuring during at least a portion of each time interval between successive intervals of clocking said second field store register for writing thereinto, said second image register being clocked in a proper direction for transferring its packets of integrated charge to said second field store register during the time said second image register is being written into.

4. Apparatus as set forth in claim 3 with:
means clocking said first image register to transfer charge packets out of said first image register by moving them in the opposite direction to said proper direction therein, for shortening the time for integrating charge in said first image register; and means clocking said second image register to transfer charge packets out of the second image register by moving them in the opposite direction to said proper direction therein, for shortening the time for integrating charge in said second image register in like amount as it is shortened in said first image register.

5. Apparatus as set forth in claim 4 wherein the times during which integrating occurs in said first and second image registers, respectively, are interleaved in time.

6. Apparatus as set forth in claim 3 wherein the times during which integrating occurs in said first and second image registers, respectively, are interleaved in time.

* * * * *

UNITED STATES PATENT AND TRADEMARK OFFICE
CERTIFICATE OF CORRECTION

PATENT NO. : 4,577,115

DATED : March 18, 1986

INVENTOR(S) : Edward Merritt Rentsch and Larry Abraham Freedman

It is certified that error appears in the above-identified patent and that said Letters Patent is hereby corrected as shown below:

Column 10, line 65 should read: --proposed by E. D. Savoye in his U.S. Pat. App. Ser. No.--

Column 12, lines 36 and 37, change "succissive" to --successive--

Signed and Sealed this

Fifteenth Day of July 1986

[SEAL]

Attest:

DONALD J. QUIGG

Attesting Officer

Commissioner of Patents and Trademarks